United States Patent
Cogar et al.

(10) Patent No.: US 8,082,190 B2
(45) Date of Patent: Dec. 20, 2011

(54) METHOD FOR TRACKING COMPONENTS IN A UTILITY METER

(75) Inventors: Angela R. Cogar, Lafayette, IN (US); John P. Junker, Wentzville, MO (US)

(73) Assignee: Landis+Gyr, Inc., Lafayette, IN (US)

( * ) Notice: Subject to any disclaimer, the term of this patent is extended or adjusted under 35 U.S.C. 154(b) by 2217 days.

(21) Appl. No.: 11/152,884

(22) Filed: Jun. 15, 2005

(65) Prior Publication Data

US 2006/0015379 A1 Jan. 19, 2006

Related U.S. Application Data

(60) Provisional application No. 60/579,849, filed on Jun. 15, 2004.

(51) Int. Cl.
G06Q 10/00 (2006.01)
G06F 19/00 (2011.01)
G06K 9/00 (2006.01)
G01R 11/56 (2006.01)

(52) U.S. Cl. ............. 705/28; 700/97; 382/147; 705/412

(58) Field of Classification Search .................. 382/147; 700/97

See application file for complete search history.

(56) References Cited

U.S. PATENT DOCUMENTS

| | | | |
|---|---|---|---|
| 4,514,815 A | 4/1985 | Anderson | |
| 5,216,612 A | 6/1993 | Cornett et al. | |
| 5,295,065 A | 3/1994 | Chapman et al. | |
| 5,307,261 A | 4/1994 | Maki et al. | |
| 5,334,822 A | 8/1994 | Sanford | |
| 5,515,269 A | 5/1996 | Willis et al. | |
| 6,041,268 A | 3/2000 | Jin | |
| 6,161,052 A * | 12/2000 | Charlton et al. | 700/97 |
| 6,480,857 B1 | 11/2002 | Chandler | |
| 6,647,304 B2 | 11/2003 | Tsukishima et al. | |
| 6,647,380 B1 | 11/2003 | Yotsukura | |
| 6,701,003 B1 * | 3/2004 | Feinstein | 382/147 |
| 6,739,512 B2 * | 5/2004 | Guerrero et al. | 235/462.01 |

* cited by examiner

Primary Examiner — Ryan Zeender
Assistant Examiner — Denisse Ortiz Roman
(74) Attorney, Agent, or Firm — Maginot, Moore & Beck

(57) ABSTRACT

A method of assembling a utility meter having a plurality of components on a subassembly is disclosed herein. The method comprises associating an identification code, such as a barcode, with the subassembly and then entering the barcode associated with the subassembly into a first memory. Next, a lot identification code for each of a plurality of components of the subassembly is associated with the barcode of the subassembly in the first memory. The subassembly is then placed in the utility meter having an associated utility meter identification code. The utility meter identification code is then entered in a second memory and the utility meter identification code is associated with the barcode of the subassembly in the second memory. The first and second memory may be searched to determine lot identification codes for each of the plurality of components in the utility meter.

20 Claims, 3 Drawing Sheets

METHOD FOR TRACKING COMPONENTS IN A UTILITY METER

CROSS-REFERENCE TO RELATED APPLICATIONS

This application claims the benefit of earlier filed U.S. Patent Application No. 60/579,849, filed Jun. 15, 2004.

BACKGROUND

This disclosure relates to the field of utility meters, and particularly to processes for tracking components in meters and recalling potentially defective meters for repair.

Electric companies install electricity meters at various locations in order to monitor the amount of electricity consumed by customers. Unfortunately, electricity meters are subject to occasional failure. When an electricity meter fails, it will likely incorrectly record the amount of electricity used by the customer, and the customer may be over-billed or under-billed for electricity consumption.

Failures in electricity meters often result from defective electronic components. In particular, electricity meters include a printed wiring board (PWB) that supports most of the electronic components for the meter. Manufacturers of the electricity meters often outsource pre-assembled PWBs from a supplier. In such a case, once the PWBs arrive from the supplier, the manufacturer of the electricity meter installs the pre-assembled PWB in the meter housing along with the other components of the meter.

Electricity meter failures due to defective electronic components often stem from a defective manufacturing process, or a defective group of parts used during the manufacturing process, including defective parts placed on the PWB during manufacture of the PWB. As a consequence, when an individual meter fails, there is a greater likelihood that other meters manufactured at or about the same time will also fail. Furthermore, if the problem with the meter can be traced to a particular component within the meter, there is a greater likelihood that other meters containing the same components from the same lot will have the same problem. For example, if a meter fails due to a defective resistor, there is a higher probability that other meters will fail that are manufactured from the same lot of resistors.

Accordingly, in order to reduce potential failures, manufacturers may preemptively repair meters that are likely to have the same problem as an already defective meter. To this end, serial numbers on the meters can be used to identify meters made at about the same time. In particular, these serial numbers identify the date the meter was assembled. With this information in hand, if a defective meter is identified, other meters with the same manufacturing date can be tracked and tested for the same problem. Unfortunately, serial number tracking to identify meters that were assembled at the same time often results in inaccurate identification of affected meters. In particular, meter serial numbers do not necessarily track to lots of individual components, particularly when PWBs are populated by an outside supplier.

When a meter manufacturer identifies a particular lot code/number for a defective component, the current method for identifying other meters that might have the same potentially defective part starts with identifying the serial number on the meter. Using the meter serial number, the manufacturer can identify other meters that were made near the same date and time as those meters may contain a component having the identified component lot code. However, not all meters made within a particular time period will necessarily contain the potentially defective component. For example, pulling all meters made on the same day as the defective meter will often result in the return of a large number of components that do not contain components from the defective lot, as it is not uncommon for a first lot of components to be used when assembling meters early in a day, while a second lot of components is used later in the day, after the first lot of components is gone.

While there is no guarantee that meters made on the same day and near the same time comprise components from the same component lots, it is also true that meters made on different days may contain components from the same component lot. This is especially the case when components used in the meters are subjected to sub-processing before they are placed on the PWBs for the meters. For example, assume the leads of a resistor must be cut to a certain length by the PWB manufacturer before the resistor is placed on the PWB. After receiving a lot of resistors from the resistor supplier, the PWB manufacturer cuts the resistor leads and transfers the resistors to an assembly bin where the resistors are mixed with resistors from other lots. During assembly of any group of PWBs, the resistors are randomly selected from the assembly bin and populated on the PWBs. Thus, a number of resistors from a given lot may be used on a given day, while several other resistors from this same lot may remain in the bin for some time until they are randomly removed during a different assembly process.

As described in the preceding paragraphs, meters made on the same day and near the same time do not always comprise components from the same component lots. Likewise, meters made on different days over significant periods of time may contain components from the same component lot. Therefore, once a defective lot of components is identified, meter manufacturers are forced to take a conservative approach and check all meters manufactured within extended time frames in order to determine if such meters contain components from the identified lot. This process of identifying other potentially affected meters is known as "bracketing", as large groups of meters made over contiguous time periods are grouped or "bracketed" together in an attempt to inspect the meters most likely containing components from the identified lot. Of course, this inaccurate method of identifying potentially affected meters forces the manufacturer to inspect more meters than those that actually contain components from the identified lot. Furthermore, if the chosen review bracket is too small, some meters will be missed. Nevertheless, even if no affected meters are missed, unaffected meters are almost always inspected and have to be returned to the field. The sorting and other labor involved with the bracketing process results in significant additional costs to the manufacturer.

Accordingly, it would be advantageous to provide a method for tracking components in an electricity meter wherein a serial number is used to not only track the manufacturing date and lot number, but the serial number is also used to identify discrete components within the meter and the component lots.

SUMMARY

A method of assembling a utility meter having a plurality of components on a subassembly, such as a printed wiring board, is disclosed herein. The method comprises associating an identification code, such as a barcode, with the printed wiring board and then entering the barcode associated with the printed wiring board into a first memory. Next, at least one lot identification code for each of a plurality of components of the printed wiring board is associated with the barcode of the printed wiring board in the first memory. The printed wiring board is then placed in the utility meter having an associated utility meter identification code. The utility meter identification code is then entered in a second memory and the utility meter identification code is associated with the barcode of the printed wiring board in the second memory. The first and second memory may be housed separately or together and may comprise separate databases or a single database.

Using the above arrangement, components in a plurality of utility meters may be tracked and, when appropriate, a plurality of potentially defective meters may be selected for recall and/or potential repair. The method comprises first identifying a defective component in at least one defective utility meter and then identifying a lot identification code for the defective component. The lot identification code for the defective component may be referred to herein as the "defective lot ID code". A database inquiry in the first database is performed to determine a plurality of subassembly identification codes for a plurality of subassemblies that include at least one component having the defective lot ID code. Then, a subsequent database inquiry of the second database is performed to determine a plurality of meter identification codes for a plurality of potentially defective utility meters that include one of the plurality of subassemblies that include at least one component having the defective lot ID code. The plurality of potentially defective utility meters are then recalled for service, including testing and/or repair. For example, the component having the defective lot ID code may be repaired or completely replaced in the utility meter.

DESCRIPTION

Figure 1A:
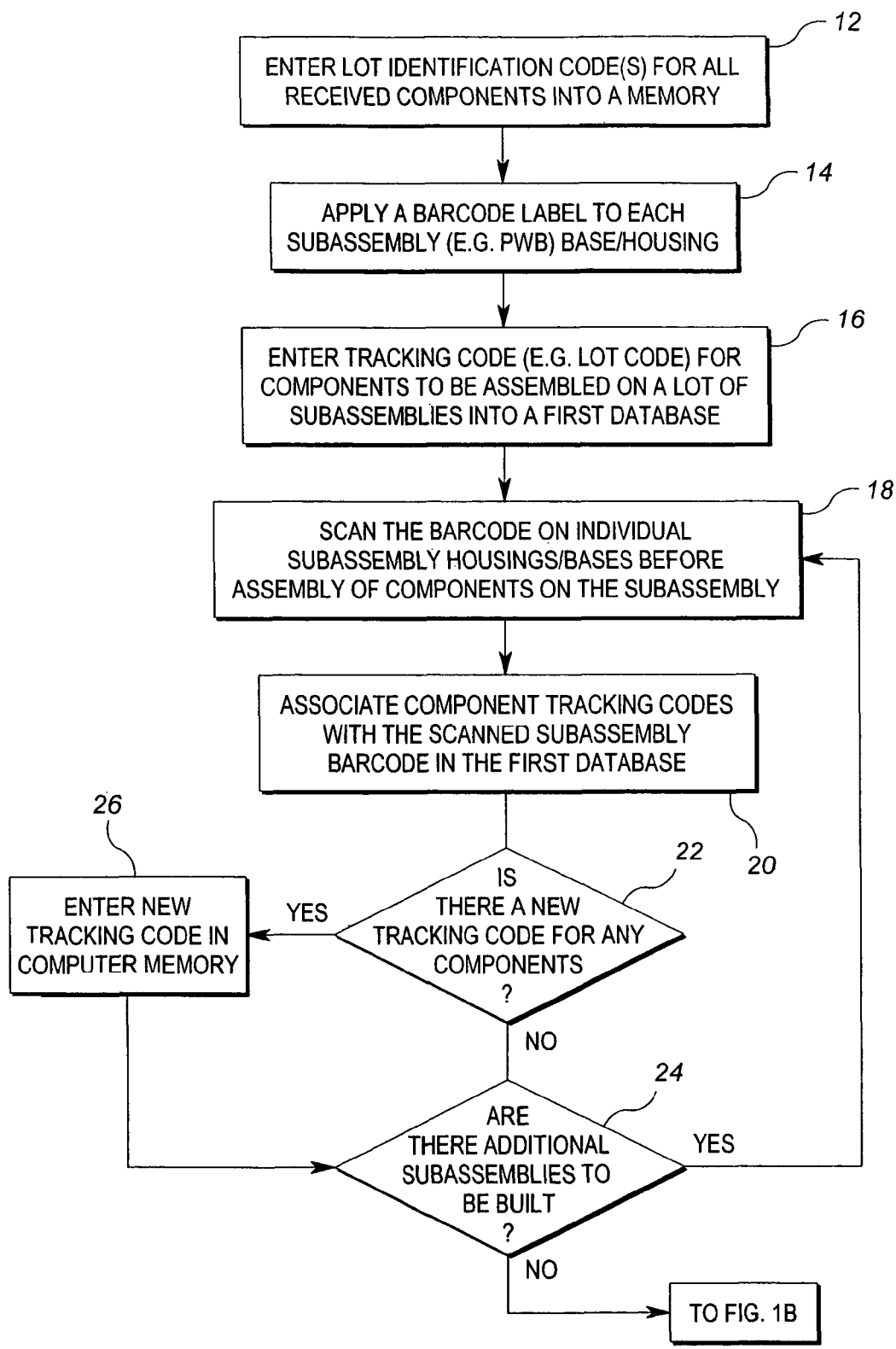
FIG. 1 is a block diagram showing the method of assembling a utility meter to provide for tracking of components in the utility meter.
Figure 1B:
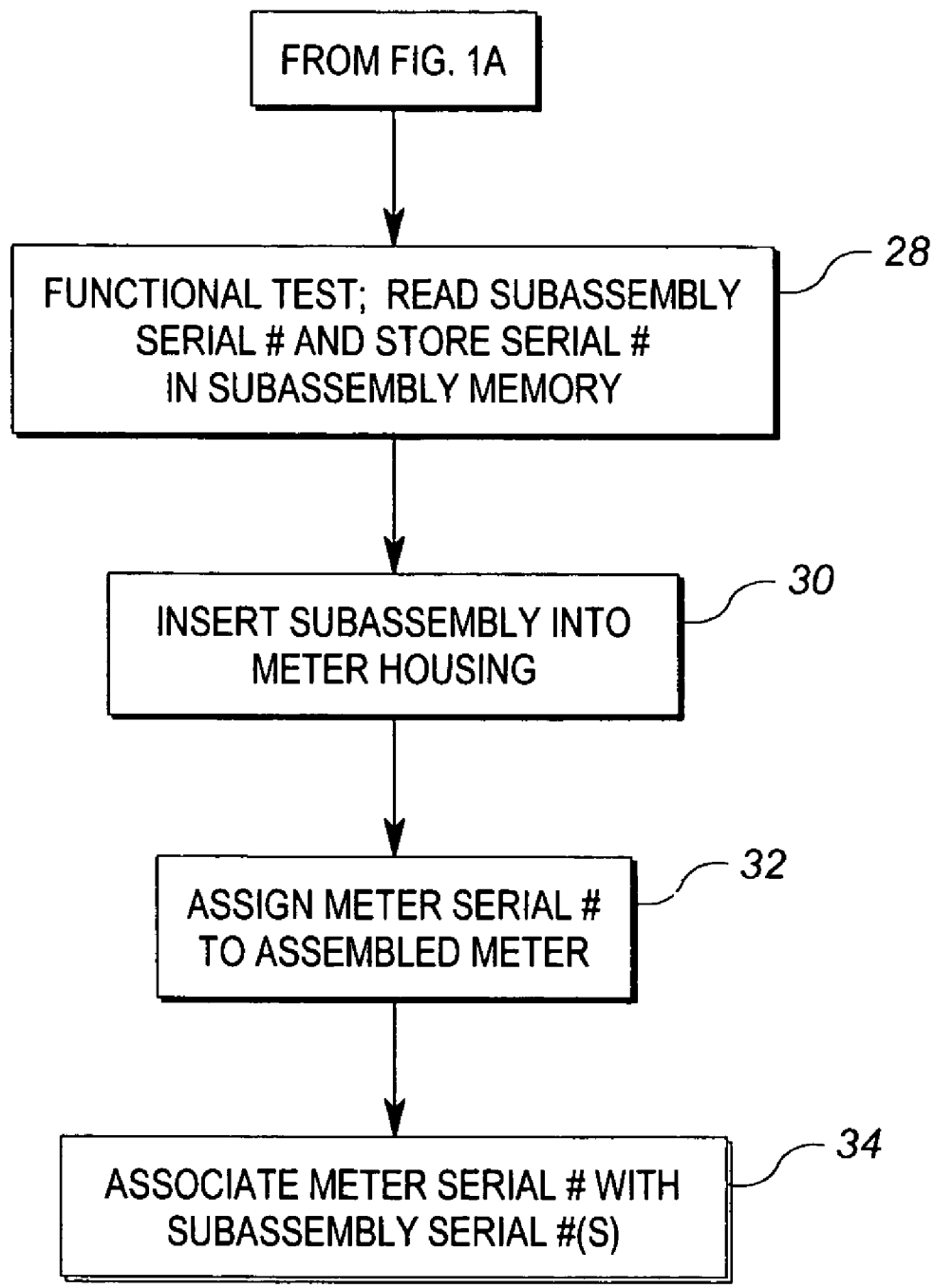

With reference to FIG. 1, a method for tracking components in a utility meter begins with a supplier receiving components for use in building a group of subassemblies. In the embodiment described herein, the subassemblies are PWBs populated with a plurality of electronic components. However, the described method using PWBs is only one embodiment, and the method may use any number of different subassemblies.

As noted in block 12 of FIG. 1, upon receipt of the components, the subassembly supplier enters the lot identification code(s) for each component lot (as assigned by the component manufacturer) into a computer inventory. The term "lot identification code" as used herein refers to a series of one or more numbers, letters and/or other codes that help identify a specific group or "lot" of components. Each component may have one or more lot identification codes associated with it. For example, the lot identification codes associated with a single component may comprise a lot code, a date code, a supplier code, and a quantity of components in a lot. The word "code" or "serial number" as used herein is intended to indicate any distinctive media capable of distinguishing one assembly or component, or group of assemblies or components, from another, such as an alpha-numeric combination of letters and numbers. Such distinctive media is typically visible and may or may not be designed for electronic capture, such as a barcode that may be optically scanned. Thus, lot identification codes may be entered into the computer inventory by scanning the lot numbers or typing the numbers in by hand, whichever is appropriate. These lot identification codes are then available for later use in populating database fields.

When the lot identification codes are entered into the database, each set of lot identification codes may include an internal tracking code. The internal tracking code is the particular lot identification code that is associated with the other lot identification codes for each component in the database. In one embodiment, the tracking code is simply one of the lot identification codes. For example, the tracking code may be the lot code or the date code printed on the component. In another embodiment, the tracking code is assigned internally and is entirely different than any of the other lot identification codes associated with that component.

As noted in block 14 of FIG. 1, the PWB supplier applies a subassembly identification code to each PWB board (or other subassembly base or housing) before any electronic components are populated on the PWB. The subassembly identification code may comprise a barcode on a barcode label which provides an identification code/serial number for the PWB. As noted in block 16, prior to starting assembly of a group of PWBs, the tracking codes for the components to be assembled on the PWBs are chosen from the computer inventory and entered into a supplier database. In the example of FIG. 1, a lot code may be used as the tracking code for the component. As each new PWB is prepared for component population, its barcode label is scanned for a PWB serial number, as shown in block 18. Then, as shown in block 20, the tracking codes (e.g., lot codes) of the components to be assembled on the PWB are associated with the PWB serial number in the supplier database. To this end, the supplier database includes a plurality of subassembly serial numbers and a plurality of fields associated with each subassembly serial number. The plurality of fields in the subassembly database identify tracking codes for components assembled on each subassembly.

As shown in blocks 22-26, if an entire component lot is used while populating a run of PWBs, the tracking code (e.g., lot code) for the new component lot is entered into the supplier database. This allows the new tracking code to be properly associated with the PWB serial number for each subsequently assembled PWB during the run. In particular, as shown in block 22, after completion of a subassembly, the system decides if a particular lot of components has been exhausted, and if a new tracking code (e.g., lot code) should be entered for a new lot. If a new lot of components is to be entered, the operator enters the new tracking code (e.g., lot code) into the supplier database in block 26 for association with the serial numbers of the PWBs to be assembled. Once all new lot information is entered, the system then determines if additional PWBs should be assembled in block 24. If additional PWBs are to be assembled, the system returns to block 18, where the barcode of the new PWB is scanned and tracking codes for the PWB are associated with the PWB barcode in the supplier database. Once a run of PWBs is completed, the supplier database may be searched by tracking code to identify the serial numbers of PWBs having components with the identified tracking code.

After each PWB is populated, a functional test is conducted on the PWB for quality assurance purposes, as shown in block 28. During this test, the serial number of the PWB is read from the barcode label and stored in a memory located on the PWB, such as a non-volatile EE-Prom provided on the PWB. This memory location is provided on individual PWBs to allow the reading of the PWB serial number using special instrumentation. As mentioned above, the tracking code (e.g., lot code)

of each component included on the PWB can be obtained by searching the supplier database under the PWB serial number.

It should be noted that this ability to track component lot identification codes with PWB serial numbers is not limited to PWBs finalized on the assembly line, but also extends to rework stations where PWBs rejected during functional testing are repaired and re-assembled. In particular, the tracking code of any component replaced at a rework station is removed from association with a PWB serial number in the supplier database, and the new component tracking code is associated with the PWB serial number in the supplier database.

The populated PWBs that pass functional testing are shipped from the supplier and received by the meter manufacturer. As noted in block 30, the meter manufacturer arranges each PWB in a meter housing along with other meter components. At some point, such as upon completion of meter assembly, the meter is assigned its own meter identification code by the meter manufacturer, such as a meter serial number. This step is shown in block 32 of FIG. 1. The meter serial number is typically displayed on the exterior of the meter housing. Once the meter is fully assembled, the meter manufacturer then places the assembled meter on a calibration rack for meter calibration and final testing. During this calibration testing, a connection is made to the EE-Prom, and calibration rack software reads the serial number stored in the EE-Prom memory of the PWB. This PWB serial number is then associated with the meter serial number and stored in a manufacturer's factory database, as shown in block 34. Each serial number is stored in a searchable field with each meter serial number associated with one of the PWB serial numbers. Therefore, if the meter manufacturer wishes to know what meter contains a certain PWB, the PWB serial number may be searched in the factory database. Likewise, if the meter manufacturer wants to know the PWB serial number for a particular meter, the meter serial number may be searched in the factory database.

Figure 2:
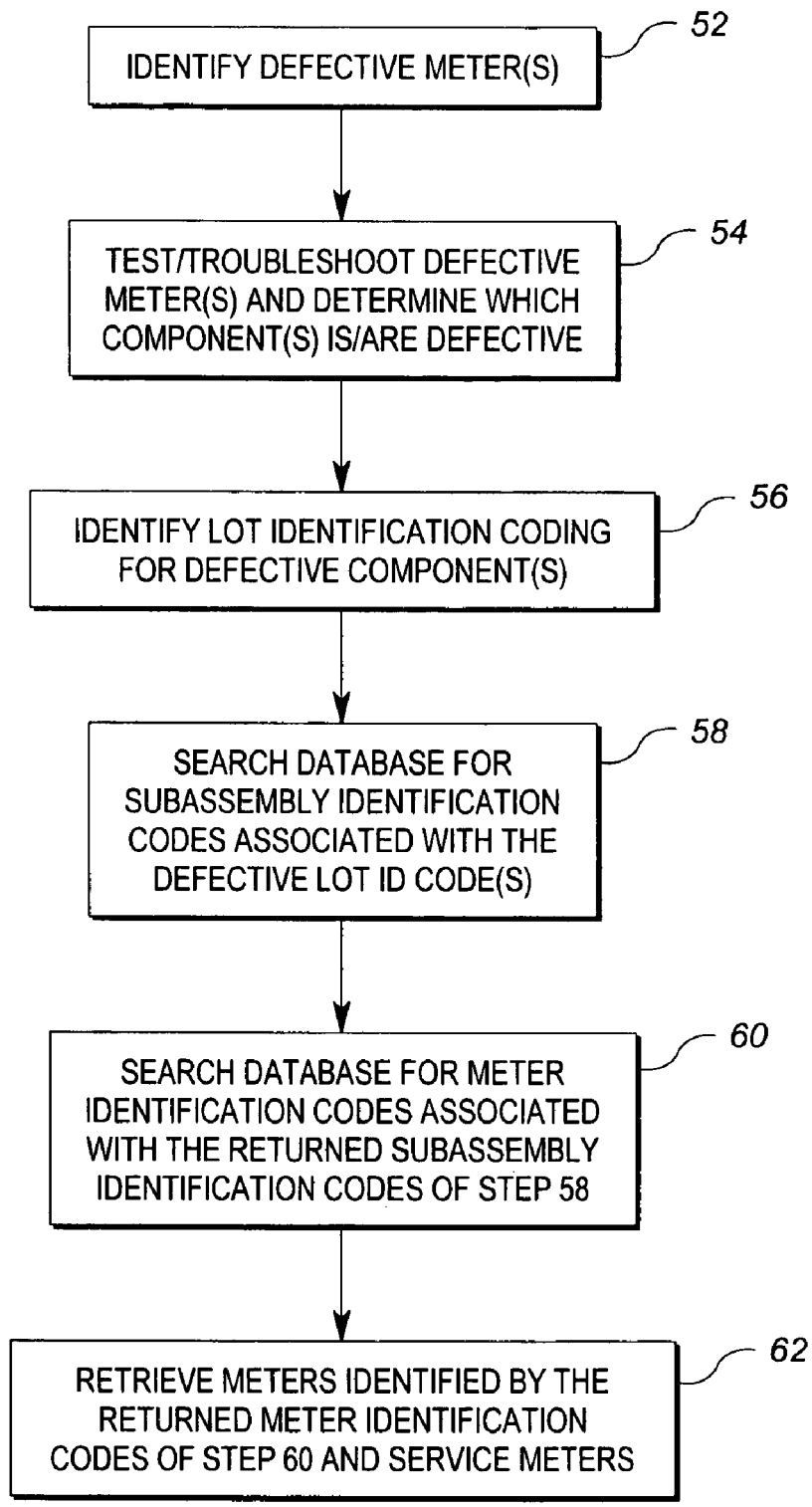
FIG. 2 is a block diagram showing a method of selecting a plurality of utility meters with potentially defective components.

With the above method in place, tracking of components in an electricity meter is easily achieved. FIG. 2 shows a block diagram of a method of selecting meters having potentially defective components which were assembled in the meter using the above-described process. As shown in block 52 of FIG. 2, the method begins by identifying at least one defective meter. Then, in block 54, the defective meter is tested to determine which component within the meter is defective. In step 56, a lot identification code is identified for the defective component. As mentioned above, the lot identification code may be a lot code, date code, separate tracking code, or other code that uniquely identifies similar components from the same lot. The supplier that provided the subassembly with the defective component is then asked in step 58 to search the supplier database and identify any subassembly identification codes associated with the defective lot ID code. When searching the supplier database, the supplier may use the defective lot ID code or the component's tracking code, if appropriate, to return a list of subassembly identification codes for subassemblies that include components from the defective lot.

After receiving a list of subassembly identification codes from the supplier, the meter manufacturer searches the manufacturer database in step 60 for all meter identification codes associated with the subassembly identification codes returned from the supplier. The meter identification codes returned from this search allow the manufacturer to identify specific meters having components with defective lot ID codes. As noted in step 62, these meters may then be retrieved from the field and/or serviced.

As an example of the method shown in FIG. 2, assume that seven meters have been identified by the manufacturer as defective in step 52. Upon testing of these meters, it is determined in step 54 that capacitor C-5 of the printed wiring board is the source of the problem with each meter. The meter manufacturer then determines in step 56 that capacitor C-5 in each of these meters has the same lot code, and that lot code represents a problematic component lot of potentially defective components. Knowing this, the meter manufacturer decides that all meters having capacitor C-5 from the problematic component lot should be replaced. To determine which meters have a capacitor C-5 from the problematic component lot, the meter manufacturer first contacts the PWB supplier and asks the supplier to provide a list of PWB serial numbers having capacitor C-5 with the identified lot code. As noted in step 58, the PWB supplier runs a database query to retrieve this information from the supplier database. Specifically, the supplier runs a query to return all PWB serial numbers associated with the identified lot code. The supplier then passes the list of PWB serial numbers returned from the query on to the meter manufacturer. The meter manufacturer then uses the manufacturer's factory database to cross-reference each PWB serial number with its associated meter serial number. Specifically, as noted in step 60, the meter manufacturer runs a query in the manufacturer's factory database to return all meter serial numbers associated with one of the PWB serial numbers returned from the supplier. The returned meter serial numbers identify those meters having a C-5 on the PWB with a lot code from the problematic lot. In one embodiment, the factory database may also provide information about the location of the meters so the manufacturer can easily retrieve the meters from the field. As noted in step 62, once the meters are retrieved from the field, the problematic capacitors are replaced, the meters are re-tested and re-calibrated, and the meters may be returned to the field for years of additional service. As shown from this example, there is no need to make educated guesses about which meters may have capacitors from the problematic lot, and there is no need to retrieve any meters from the field that do not have capacitors from the problematic lot. At the same time, the manufacturer can be confident that all meters with capacitors from the problematic lot have been retrieved. Accordingly, significant cost savings are realized by the manufacturer when defective parts are identified, as there is no need for the manufacturer to participate in bracketing or sorting of potentially defective meters.

Many advantages may be realized by implementation of the method disclosed herein. One advantage of the disclosed method of tracking components is that the meter manufacturer is empowered to perform more efficient meter recalls, maintenance and repair. For example, a defective component may be identified as a part of a 10,000 piece lot, based on the lot identification codes. As discussed above, by searching the databases, a list of PWBs that include components from the defective lot is returned. By analyzing the different types PWBs on this list, it may be discovered that only 1000 of these defective components are used in manner that could cause defective operation. With this information in hand, field exposure may be accurately defined, and a more efficient and cost-effective recall procedure may be performed. In addition, when components are used across multiple product lines, suspect units from other products may be recalled prior to customers experiencing failure.

Although the above method for tracking components in an electricity meter has been described with respect to certain preferred embodiments described herein, it is noted, however, that the embodiments described herein are merely exemplary, and that those of ordinary skill in the art may readily devise their own implementations that incorporate the principals of the present invention and fall within the spirit and scope thereof. For example, in another exemplary embodiment, different subassemblies are added to or used in place of the PWBs described above. Also, the subassemblies, including the PWBs, need not be manufactured at the supplier's location, but the meter manufacturer may assemble one or several subassemblies before building the actual meter. Along similar lines, the supplier database and the manufacturer database described above may be comprised within the same database. Furthermore, it is noted that alternative embodiments of the present invention may not include all of the features described herein yet still benefit from at least some of the advantages of the invention. Those of ordinary skill in the art may readily devise their own such implementations that incorporate one or more of the features of the present invention and fall within the spirit and scope thereof. It is further noted that the present invention is not limited to electrical utility meters, and thus, the present invention may readily be incorporated into other types of electronic utility meters, including gas meters, water meters, or other utility meters.

What is claimed is:

1. A method of selecting a plurality of meters, the method comprising:
   a) identifying a defective component in at least one defective utility meter;
   b) identifying a lot identification code for the defective component;
   c) performing a database inquiry to determine a plurality of subassembly identification codes for a plurality of subassemblies, each of the plurality of subassemblies including at least one component having the lot identification code for the defective component; and
   d) performing a database inquiry to determine a plurality of meter identification codes for a plurality of potentially defective utility meters, each of the plurality of potentially defective utility meters including one of the plurality of subassemblies.

2. The method of claim 1 further comprising the step of recalling the plurality of potentially defective utility meters, wherein the plurality of potentially defective meters are identified based on the determined plurality of subassemblies including at least one component having the lot identification code for the defective component and not based on bracketing of a group of meters manufactured over a contiguous period of time.

3. The method of claim 1 further comprising the step of testing the plurality of potentially defective utility meters to determine if any of the plurality of potentially defective utility meters are actually defective.

4. The method of claim 1 further comprising the step of repairing each of the plurality of potentially defective utility meters.

5. The method of claim 4 wherein the step of repairing each of the plurality of potentially defective utility meters comprises replacing the at least one component having the lot identification code.

6. The method of claim 4 wherein the step of repairing each of the plurality of potentially defective utility meters comprises replacing the subassembly that includes the at least one component having the lot identification code.

7. A method of tracking components in utility meters, the method comprising:
   a) recording in a first memory a plurality of subassembly identification codes, each of the plurality of subassembly identification codes identifying one of a plurality of subassemblies;
   b) recording in the first memory a plurality of lot identification codes associated with each of the plurality of subassembly identification codes, each of the plurality of lot identification codes identifying a particular lot of components;
   c) recording in a second memory a plurality of meter identification codes, each of the plurality of meter identification codes identifying one of a plurality of utility meters; and
   d) respectively associating in the second memory each of the plurality of subassembly identification codes with one of the plurality of meter identification codes.

8. The method of claim 7 further comprising the steps of identifying a defective lot identification code from the plurality of lot identification codes, searching the first memory to identify a plurality of potentially defective subassemblies associated with the defective lot identification code, and searching the second memory to identify a plurality of potentially defective meters each respectively associated with one of the plurality of potentially defective subassemblies.

9. The method of claim 7 wherein the first memory is housed with the second memory.

10. The method of claim 7 wherein the first memory is housed separate from the first memory.

11. The method of claim 7 wherein the first memory comprises a first database and the second memory comprises a second database separate from the first database.

12. The method of claim 7 wherein the first memory and second memory comprise a single database.

13. The method of claim 7 wherein each of the plurality of subassemblies includes a subassembly memory, and further comprising the step of recording each of the plurality of subassembly identification codes in one of the subassembly memories.

14. A method of assembling a utility meter including a printed wiring board having a plurality of components, the method comprising:
   a) associating a barcode with the printed wiring board;
   b) entering the barcode of the printed wiring board into a first memory;
   c) associating a lot identification code for each of the plurality of components of the printed wiring board with the barcode of the printed wiring board in the first memory;
   d) placing the printed wiring board in the utility meter;
   e) associating the utility meter with a utility meter identification code;
   f) entering the utility meter identification code in a second memory; and
   g) associating the utility meter identification code with the barcode of the printed wiring board in the second memory.

15. The method of claim 14 wherein the first memory is housed with the second memory.

16. The method of claim 14 wherein the first memory and the second memory comprise a single database.

17. The method of claim 14 further comprising the step of subjecting the printed wiring board to functional testing before it is placed in the utility meter.

18. The method of claim 17 further comprising the step of removing the lot identification code for at least one of the plurality of components from association with the barcode of the printed wiring board in the first database if the printed wiring board fails functional testing.

19. The method of claim 18 further comprising the step of removing at least one of the plurality of components from the printed wiring board and replacing the at least one of the plurality of components with at least one new component.

20. The method of claim 19 further comprising the step of associating at least one lot identification code for the at least one new component with the barcode of the printed wiring board in the first memory.

* * * * *